United States Patent [19]

Rentschler

[11] 4,239,787

[45] Dec. 16, 1980

[54] SEMITRANSPARENT AND DURABLE PHOTOLITHOGRAPHY MASKS

[75] Inventor: John A. Rentschler, Brick Township, Ocean County, N.J.

[73] Assignee: Bell Telephone Laboratories, Incorporated, Murray Hill, N.J.

[21] Appl. No.: 51,848

[22] Filed: Jun. 25, 1979

[51] Int. Cl.³ .............................................. B05D 3/06
[52] U.S. Cl. ..................................... 427/38; 427/43.1; 427/54.1; 430/326; 430/328
[58] Field of Search ................... 427/38, 39, 40, 43.1, 427/54.1; 430/326, 328

[56] References Cited

U.S. PATENT DOCUMENTS

| | | | |
|---|---|---|---|
| 3,443,915 | 5/1969 | Wood et al. | 29/194 |
| 3,920,483 | 11/1975 | Johnson et al. | 427/38 |
| 3,949,259 | 4/1976 | Kostlin et al. | 313/112 |
| 4,093,504 | 6/1978 | Ponjee et al. | 156/656 |
| 4,137,365 | 1/1979 | Fletcher | 427/40 |

OTHER PUBLICATIONS

Elie, "IBM Tech. Disc. Bull.," vol. 17, No. 1, p. 85, Jun. 1974.
Fredericks, "IBM Tech. Disc. Bull.," vol. 21, No. 7, p. 2824, Dec. 1978.

*Primary Examiner*—John H. Newsome
*Attorney, Agent, or Firm*—David R. Padnes

[57] ABSTRACT

A semitransparent photolithography mask, i.e., one transparent to a portion of the visible light spectrum, is achieved by electron and ion bombardment of a positive photoresist. This bombardment is performed after the desired photoresist pattern is defined by the sequential steps of depositing, baking and developing the photoresist (14) on a light transparent substrate (15). In the preferred embodiment, the electron and ion bombardment is accomplished in a predominantly nitrogen atmosphere within a sputtering chamber using indium tin oxide as the sputtering target. As a result of the bombardment, the photoresist is converted into a material which is opaque to only the ultraviolet portion of the light spectrum.

4 Claims, 3 Drawing Figures

SEMITRANSPARENT AND DURABLE PHOTOLITHOGRAPHY MASKS

TECHNICAL FIELD

This invention relates to a method of fabricating photolithography masks which are semitransparent, i.e., transparent to a portion of the visible light spectrum, and extremely durable.

BACKGROUND OF THE INVENTION

Photolithography masks are used in the fabrication of integrated circuits and other planar thin film devices, such as surface acoustical wave (SAW) devices. Such fabrication requires the ability to evaporate and/or etch material in precisely defined patterns on a device substrate.

A commonly used technique of pattern definition involves the use of photoresist, an ultraviolet (UV) sensitive material, and photolithography masks. The mask, containing an actual or reverse replica of the desired pattern, is placed over a photoresist covered device substrate. The mask selectively filters out the UV light, thereby limiting UV exposure to predefined photoresist regions. In the case of positive photoresist, the photoresist in the UV exposed areas is softened and easily removed. Actual device formation is then accomplished by either etching and/or evaporating material within areas defined by the remaining photoresist. Several etching and/or evaporation steps are normally used, requiring the alignment of a sequence of masks to a common reference point on the device substrate.

When device formation requires positive photoresist, a dark field mask is generally used. In such case, sequential mask alignment is burdensome as substantially all of the mask is opaque. While a semitransparent mask eliminates this alignment problem, prior techniques for generating semitransparent masks require selective chemical etching of a thin film having the desired optical properties. This etching step precludes the use of semitransparent masks for fabricating devices with small line widths of three micrometers ($\mu$m) or less.

SUMMARY OF THE INVENTION

According to the present invention semitransparent photolithography masks are fabricated using positive photoresist. The desired photoresist pattern is defined on a light transparent substrate by first depositing a uniform photoresist layer on the substrate and then baking the photoresist to harden it. Selective exposure to UV light softens the exposed photoresist permitting removal with a commerical developer.

Following pattern definition, the remaining photoresist is subjected to electron and ion bombardment. This bombardment converts the clear photoresist to a semitransparent material which is opaque to the ultraviolet portion of the light spectrum. In the preferred embodiment, this bombardment and resulting polymerization is performed by vacuum sputtering indium tin oxide in a predominantly nitrogen atmosphere.

It is a feature of the present invention that the ion and electron bombardment makes the photoresist extremely scratch resistant and impervious to etchants.

It is a still further feature of the present invention that the semitransparent mask is fabricated without the need for chemical etching of a thin film, and is capable of providing precise definition of small line patterns of 3 $\mu$m or less.

DETAILED DESCRIPTION

Figure 1:
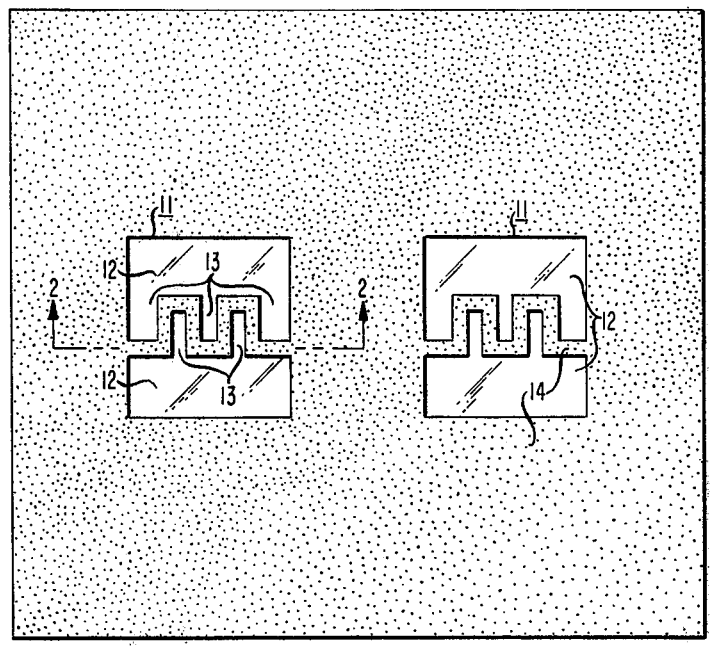
FIG. 1 shows a photolithography mask to which the present invention pertains.
Figure 2:
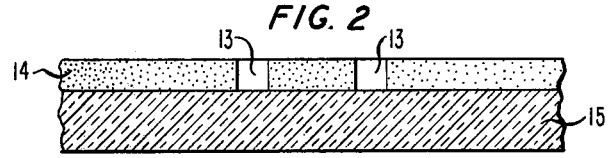
FIG. 2 is a fragmentary sectional view of FIG. 1.
Figure 3:
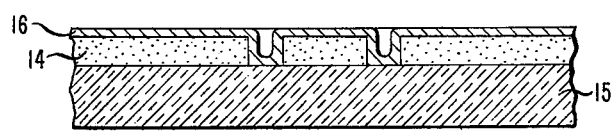
FIG. 3 is an enlarged view of FIG. 2 onto which a layer of indium tin oxide is deposited pursuant to the preferred embodiment of the present invention.

FIGS. 1, 2 and 3 depict a photolithography mask constructed pursuant to the preferred embodiment of the present invention. For purposes of illustration, the device geometry shown is required for the fabrication of two SAW transducers 11. Each transducer 11 comprises two pad areas 12 and a plurality of interdigitated fingers 13 which extend therefrom. Both pads 12 and fingers 13, shown substantially enlarged for clarity, are defined in a photoresist layer 14 deposited onto light transparent substrate 15.

Positive photoresist, such as the widely used Shipley AZ 1350B a trade named photoresist of Shipley Co. Inc. of Newton, Mass. (manufactured in the U.S. for Shipley by Azoplate, a division of American Hoechst Corp. of Murray Hill, New Jersey) or the LSI 295 photoresist, a trade name of the Phillip A. Hunt Chemical Co., Palisades Park, New Jersey, is preferable for defining fingers 13 which illustratively are 3 $\mu$m wide with a 3 $\mu$m separation.

Light transparent substrate 15 may be any of a variety of materials, such as glass, silicon dioxide or quartz. If the latter two materials are used, a 5 Angstrom (A) layer of chromium (not shown) is preferably deposited first to improve photoresist adhesion to substrate 15.

A uniform photoresist layer can be formed by spin coating clear liquid positive photoresist onto substrate 15 for 30 seconds at 3000 rpm. To solidify the photoresist, substrate 15 is then baked for 12 minutes in an oven heated to between 85 and 90 degrees Centigrade. After baking substrate 15 is placed in direct contact with a master mask, having the illustrated finger and pad geometry, and exposed to a collimated ultraviolet light source. The tiny portions of photoresist exposed to ultraviolet light are softened and may be readily moved using a commerically available developer solution, such as Shipley AZ developer a trade named product of the Shipley Co., Inc.of Newton, Mass. The remaining photoresist layer 14 covers substantially all of substrate 15 with only the pad 12 and finger 13 areas of substrate 15 being visible.

To form a semitransparent mask, i.e., one transparent to a portion of the visible light spectrum and opaque in the UV region, the remaining photoresist is subjected to electron and ion bombardment. Pursuant to the preferred embodiment, this bombardment occurs in a plasma sputtering system using a transparent target material of indium tin oxide. As shown in FIG. 3, indium tin oxide layer 16 is sputtered over both photoresist layer 14 and the exposed portions of substrate 15 which define pads 12 and fingers 13. While various electron and ion bombardment techniques may be used, the sputtering of indium tin oxide in a predominantly nitrogen atmosphere is preferable. Such sputtering, in addition to providing a uniform indium tin oxide layer 16, causes the polymerization of AZ photoresist layer 14. This polymerization modifies the optical transmission properties of the photoresist making it substantially opaque to UV radiation and at the same time impervious to etchants such as acetone, methyl alcohol, trichlorethylene and hydrochloric acid. For example, masks with a sputtering layer of indium tin oxide do not begin to decompose until immersion for one hour in commercially available resist stripper heated to 80 degrees Centrigrade.

It should be noted that while indium tin oxide is preferable, aluminum oxide can also be used as a target material. Moreover, it is only necessary to subject the photoresist material to electron and ion bombardment. For simplicity of application, FIG. 3 shows indium tin oxide layer 16 covering both photoresist layer 14 and the exposed portions of substrate 15.

Satisfactory mask samples were produced in an MRC model 8612 sputter-etch system having a 6 inch diameter indium tin oxide sputtering target. The bell jar was first evacuated to $8 \times 10^{-7}$ torr and then backfilled to $6 \times 10^{-3}$ torr with nitrogen. Alternatively, the bell jar can be backfilled to $6 \times 10^{-3}$ torr of forming gas, a mixture of 80 percent nitrogen and 20 percent hydrogen and less attractively with other nonoxidizing gases. The masks were all sputter etched with 100 watts of RF power for one minute to burn off any accumulated residue. The system was then placed in the sputter deposition mode (substrate on the anode) and 500 watts of RF power was applied for five minutes with an indium tin oxide target to substrate distance of about 5.6 centimeters. Mask samples so treated were semitransparent and had a dark yellow-orange hue. Optical density measurements performed on the samples indicated that the UV wavelength region, less than 500 nanometers, had been filtered out.

If desired, alteration of the optical density cutoff can be achieved by varying the amount of the RF power and the type of sputter atmosphere. An increase in RF power will increase the cutoff wavelength with a corresponding decrease in the transparency of the mask. A power setting between 700-800 watts, for example, will yield an optical density similar to that of ferric oxide. Similarly, a mask sputtered in a forming gas atmosphere will increase the cutoff point more per amount of power applied, but the transparency of the mask will diminish faster than in a nitrogen atmosphere.

I claim:

1. A method of producing photolithography masks, transparent to a portion of the visible spectrum, comprising the steps of:
   (a) depositing positive photoresist (14) onto a light transparent substrate (15) to achieve a uniform coating;
   (b) baking the deposited photoresist to fix the same;
   (c) selectively exposing said photoresist to ultraviolet radiation;
   (d) developing said photoresist to remove the exposed portions thereof and further CHARACTERIZED BY the step of
   (e) bombarding said photoresist with electrons and ions in a predominantly nitrogen atmosphere to convert said photoresist to a material opaque to ultraviolet light.

2. The method of claim 1 wherein said bombardment is performed in a sputtering chamber.

3. The method of claim 2 wherein indium tin oxide is sputtered in a chamber under a vacuum of $6 \times 10^{-3}$ torr using 500 watts of RF power for five minutes.

4. The method of claim 3 further including the step of sputtering a layer of chromium on the light transparent substrate prior to the step of depositing said positive photoresist onto said light transparent substrate.

* * * * *